United States Patent
Koyama et al.

(10) Patent No.: US 11,011,663 B2
(45) Date of Patent: May 18, 2021

(54) SEMICONDUCTOR ELEMENT FOR OSCILLATING OR DETECTING TERAHERTZ WAVE AND MANUFACTURING METHOD OF SEMICONDUCTOR ELEMENT

(71) Applicant: CANON KABUSHIKI KAISHA, Tokyo (JP)

(72) Inventors: Yasushi Koyama, Kamakura (JP); Jun Iba, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/589,475

(22) Filed: Oct. 1, 2019

(65) Prior Publication Data

US 2020/0111929 A1 Apr. 9, 2020

(30) Foreign Application Priority Data

Oct. 4, 2018 (JP) .............................. JP2018-189244

(51) Int. Cl.
*H01L 31/101* (2006.01)
*H01L 31/0352* (2006.01)
(Continued)

(52) U.S. Cl.
CPC ...... *H01L 31/101* (2013.01); *H01L 31/02161* (2013.01); *H01L 31/022408* (2013.01);
(Continued)

(58) Field of Classification Search
CPC ............. H01L 31/101; H01L 31/02161; H01L 31/022408; H01L 31/035272;
(Continued)

(56) References Cited

U.S. PATENT DOCUMENTS 6,549,553 B1 * 4/2003 Uenohara ........... H01S 5/18308
372/46.01
9,018,672 B2 4/2015 Sekiguchi et al.
(Continued)

FOREIGN PATENT DOCUMENTS

JP 2017005690 A 1/2017

OTHER PUBLICATIONS

"Resonant Tunneling Diodes for Sub-Terahertz and Terahertz Oscillators" Jpn.J.Appl.Phys., vol. 47, No. 6 (2008), pp. 4375-4384.
(Continued)

*Primary Examiner* — Peter Bradford
(74) *Attorney, Agent, or Firm* — Venable LLP

(57) ABSTRACT

A semiconductor element which oscillates or detects a terahertz wave, the semiconductor element comprising: a first electrode; a semiconductor layer having a gain of the terahertz wave; a second electrode which forms a mesa structure together with the semiconductor layer; a third electrode; a fourth electrode; a first dielectric layer which is in contact with the third electrode and which surrounds the mesa structure; and a second dielectric layer which is arranged between the first electrode and the fourth electrode, which surrounds the third electrode, and which is made of a different material from the first dielectric layer, wherein the first electrode, the semiconductor layer, the second electrode, the third electrode, and the fourth electrode are stacked in this order from a side of the substrate in a direction perpendicular to the substrate, and a predetermined mathematical expression is satisfied.

12 Claims, 10 Drawing Sheets

(51) Int. Cl.
  *H01L 31/18* (2006.01)
  *H01L 31/0216* (2014.01)
  *H01S 5/042* (2006.01)
  *H01Q 9/04* (2006.01)
  *H01L 31/0224* (2006.01)
  *H01S 5/34* (2006.01)
  *H01L 31/0304* (2006.01)

(52) U.S. Cl.
  CPC .. *H01L 31/035272* (2013.01); *H01L 31/1844* (2013.01); *H01Q 9/0407* (2013.01); *H01S 5/0425* (2013.01); *H01L 31/03046* (2013.01); *H01L 31/035236* (2013.01); *H01S 5/3402* (2013.01)

(58) Field of Classification Search
  CPC ........... H01L 31/1844; H01L 31/03046; H01L 31/035236; H01Q 9/0407; H01S 5/0425; H01S 5/3402
  See application file for complete search history.

(56) References Cited

U.S. PATENT DOCUMENTS

| | | | |
|---|---|---|---|
| 2010/0017922 A1* | 1/2010 | Shin | G01Q 60/22 850/21 |
| 2010/0244993 A1* | 9/2010 | Sekiguchi | H03B 7/08 333/219.1 |
| 2010/0244994 A1* | 9/2010 | Sekiguchi | H03B 7/08 333/219.1 |
| 2011/0155998 A1* | 6/2011 | Koyama | H01L 29/882 257/13 |
| 2012/0161003 A1* | 6/2012 | Tsuchiya | G01J 5/024 250/338.3 |
| 2014/0145280 A1* | 5/2014 | Sekiguchi | H01L 23/66 257/428 |
| 2017/0271774 A1* | 9/2017 | Mukai | G01R 31/311 |
| 2018/0076376 A1* | 3/2018 | Brady | H01L 35/02 |

OTHER PUBLICATIONS

"Fundamental Oscillation up to 1.42 THz in Resonant Tunneling Diodes by Optimized Collector Spacer Thickness" Infrared Milli Terahz Waves (2014), 35: 425-431.

"High-Power Operation of Terahertz Oscillators With Resonant Tunneling Diodes Using Impedance-Matched Antennas and Array Configuration" IEEE J. Sel. Top. Quantum Electron., 19 (2013), 8500108.

* cited by examiner

SEMICONDUCTOR ELEMENT FOR OSCILLATING OR DETECTING TERAHERTZ WAVE AND MANUFACTURING METHOD OF SEMICONDUCTOR ELEMENT

BACKGROUND OF THE INVENTION

Field of the Invention

The present invention relates to a semiconductor element for oscillating or detecting a terahertz wave and to a manufacturing method of the semiconductor element.

Description of the Related Art

As current injection-type light sources that generate an electromagnetic wave in a frequency range of at least 30 GHz and not more than 30 THz (hereinafter, referred to as a "terahertz wave"), oscillators (semiconductor elements) which integrate an element having an electromagnetic gain of the terahertz wave are known. In particular, oscillators integrating an antenna having a resonant tunneling diode (RTD) are showing promise due to their ability to operate in room temperature at a frequency range in the vicinity of 1 THz.

For example, Jpn. J. Appl. Phys., Vol. 47, No. 6 (2008), pp. 4375-4384 (referred to as Non Patent Literature 1) discloses a terahertz wave oscillator in which a slot antenna resonator having an RTD is integrated on a semiconductor substrate. In Non Patent Literature 1, a double-barrier RTD which is epitaxially grown on an InP substrate and which is constituted by an InGaAs quantum well layer and an AlAs tunnel barrier layer is used. With an oscillator using such an RTD, oscillation of a terahertz wave can be realized in room temperature in a range where a differential negative resistance is obtained in voltage-current (V-I) characteristics.

In addition, Japanese Patent Application Laid-open No. 2017-5690 discloses a terahertz wave oscillator in which a patch antenna having an RTD is integrated on a substrate.

Furthermore, with an oscillator using a microstrip resonator such as a patch antenna, increasing a thickness of a dielectric layer formed between an electrode formed on a surface of the oscillator and an electrode that is a grounded conductor is known to improve radiant efficiency. This also applies to a receiver and reception efficiency is improved by increasing the dielectric layer. Japanese Patent Application Laid-open No. 2017-5690 also discloses an oscillator (a semiconductor element) having a sufficiently-thick dielectric layer.

SUMMARY OF THE INVENTION

On the other hand, in the oscillator (the semiconductor element) described in Japanese Patent Application Laid-open No. 2017-5690, since the dielectric layer is thick, an electrode for electrically connecting the electrode formed on the surface and the RTD to each other and the like are formed, resulting in an element structure in which the two electrodes sandwich a thin portion of the dielectric layer. Therefore, parasitic resistance and parasitic capacitance are increased (created) by the element structure. As described above, conventionally, when a structure with a thicker dielectric layer is adopted for the purpose of improving radiant efficiency (reception efficiency) of an oscillator (a semiconductor element), a parasitic capacitance is increased by the structure.

The present invention has been made in consideration of the above, and an object thereof is to provide a semiconductor element which oscillates or detects a terahertz wave and which is capable of suppressing a parasitic capacitance when a dielectric layer is made thicker in order to improve radiant efficiency or reception efficiency.

A first aspect of the present invention is a semiconductor element which oscillates or detects a terahertz wave, the semiconductor element comprising:

a first electrode;

a semiconductor layer having a gain of the terahertz wave;

a second electrode which is connected to the semiconductor layer and which forms a mesa structure together with the semiconductor layer;

a third electrode electrically connected to the semiconductor layer;

a fourth electrode connected to the third electrode;

a first dielectric layer which is in contact with the third electrode and which surrounds the mesa structure; and a second dielectric layer which is arranged between the first electrode and the fourth electrode, which surrounds the third electrode, and which is made of a different material from the first dielectric layer, wherein the first electrode, the semiconductor layer, the second electrode, the third electrode, and the fourth electrode are stacked in this order from a side of the substrate in a direction perpendicular to the substrate, and a direction parallel to the substrate in the semiconductor element is defined as an in-plane direction, the following mathematical expression is satisfied.

$d_0 \le d_2 \le d_1$, where $d_0$: length in the in-plane direction of the semiconductor layer, $d_2$: length in the in-plane direction of a surface in contact with the third electrode in the first dielectric layer, and $d_2$: length in the in-plane direction of a surface in contact with the first dielectric layer in the third electrode A second aspect of the present invention is a manufacturing method of a semiconductor element which oscillates or detects a terahertz wave and which has a semiconductor layer formed between a first electrode and a fourth electrode, the manufacturing method comprising:

a step of forming the semiconductor layer having a gain of the terahertz wave and a second semiconductor layer constituting a part of the first electrode on a substrate;

a step of forming a second electrode on the semiconductor layer;

a step of forming the first electrode by forming a metal layer on the second semiconductor layer;

a step of forming a first dielectric layer which surrounds a mesa structure formed by the semiconductor layer and the second electrode;

a step of forming a via hole in the first dielectric layer in order to electrically connect the second electrode and the fourth electrode to each other and forming, in the via hole, a fifth electrode to be connected to the second electrode;

a step of forming a second dielectric layer which surrounds the mesa structure, the fifth electrode, and the first dielectric layer and which is formed by a different material from the first dielectric layer;

a step of forming a via hole in the second dielectric layer in order to electrically connect the second electrode and the fourth electrode to each other and forming, in the via hole, a third electrode to be connected to the fifth electrode; and a step of forming the fourth electrode which, together with the first electrode, sandwiches the second dielectric layer and which is connected to the third electrode.

According to the present invention, in a semiconductor element which oscillates or detects a terahertz wave, a parasitic capacitance when a dielectric layer is made thicker in order to improve radiant efficiency or reception efficiency can be suppressed.

Further features of the present invention will become apparent from the following description of exemplary embodiments with reference to the attached drawings.

DESCRIPTION OF THE EMBODIMENTS

First Embodiment

Configuration of Element

An element 100 which is a semiconductor element according to the present embodiment will be described with reference to FIGS. 1A and 1B. The element 100 is a semiconductor element which oscillates or detects a terahertz wave with a frequency of $f_{THz}$.

Figure 1A:
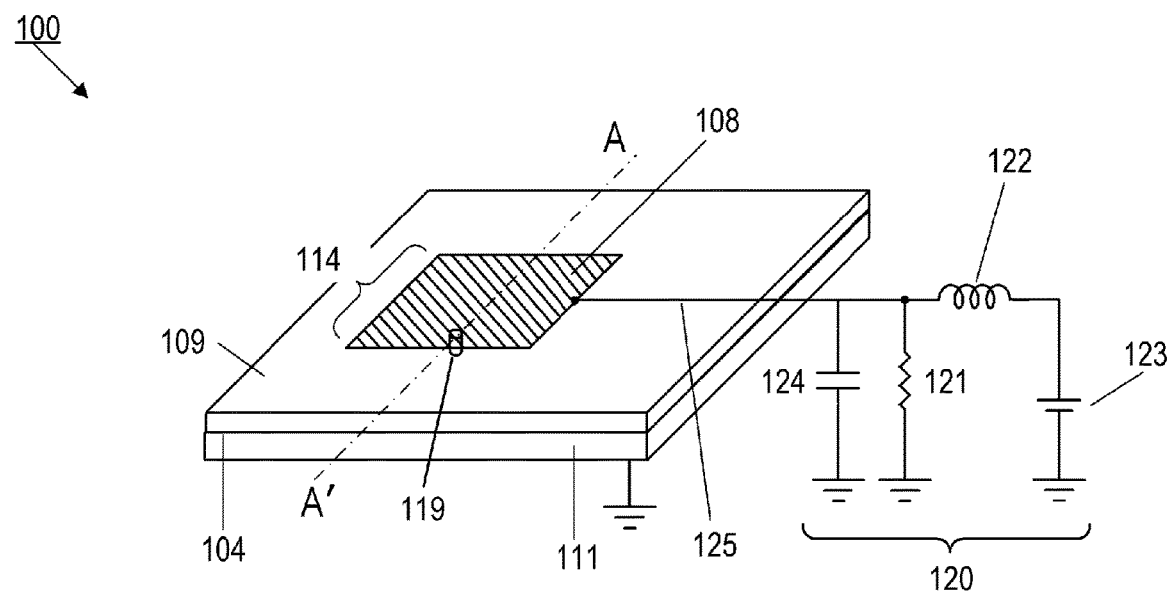
FIGS. 1A and 1B are diagrams illustrating a configuration of a semiconductor element according to a first embodiment.
Figure 1B:
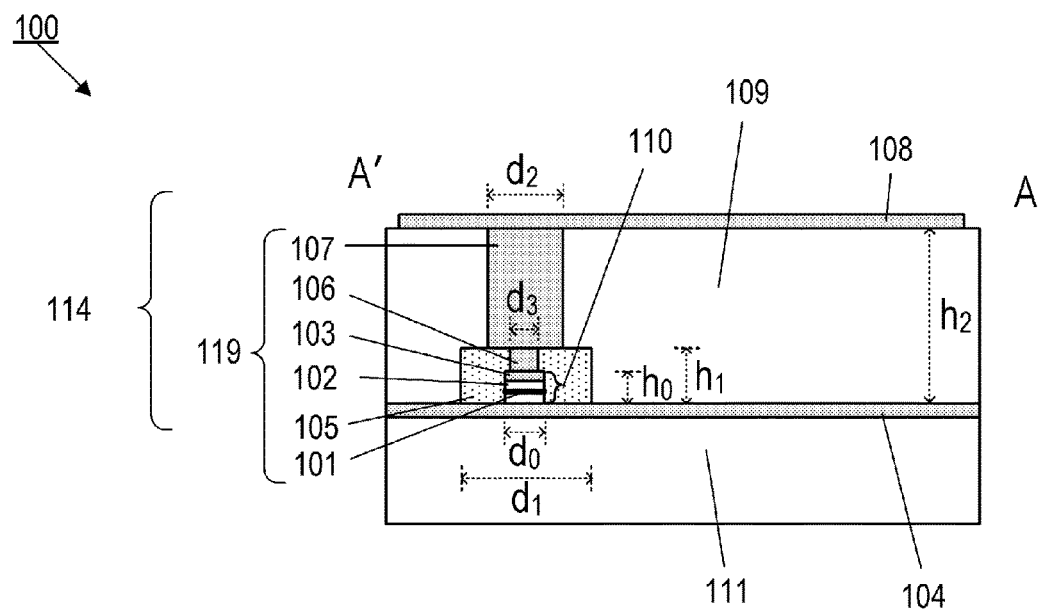

FIG. 1A is a perspective view showing an external appearance of the element 100, and FIG. 1B is a sectional view of the element 100 taken along a straight line AA' shown in FIG. 1A. In this case, a terahertz wave refers to an electromagnetic wave within a frequency range of at least 30 GHz and not more than 30 THz. It should be noted that the straight line AA' is a straight line which is parallel to a direction of resonance of a terahertz wave oscillated or detected by the element 100 (a resonator 114) and which passes through a center of gravity point (a center) of the resonator 114.

First, a configuration of the element 100 will be described. The element 100 includes, as main components, the resonator 114 for oscillating or detecting a terahertz wave and a bias circuit 120. Hereinafter, an example in which the element 100 is used as a terahertz wave oscillator will be described. However, as another example, the element 100 can be operated as a terahertz wave detector using a range in current-voltage characteristics of an active layer (an RTD) where non-linearity of a current occurs with a voltage variation.

Resonator

The resonator 114 includes a semiconductor layer 102, a second electrode 103, a first electrode 104, a first dielectric layer 105, a fifth electrode 106, a third electrode 107, a fourth electrode 108, and a second dielectric layer 109. In addition, the semiconductor layer 102 includes an RTD 101. The semiconductor layer 102 and the second electrode 103 constitute (form) a mesa structure 110. Hereinafter, a portion constituting the semiconductor layer 102, the second electrode 103, the first dielectric layer 105, the fifth electrode 106, and the third electrode 107 will be referred to as a semiconductor portion 119. In addition, in the following description, a length of each component in a stacking direction of the respective electrodes and the semiconductor layer 102 or, in other words, a direction perpendicular to a substrate 111 will be referred to as a "thickness" or a "height". A length in a direction (a resonant direction; an AA' direction) which is perpendicular to the stacking direction of the respective electrodes and the semiconductor layer 102 and in which a terahertz wave resonates in the resonator 114 (the element 100) will be referred to as a "width". Furthermore, in the "height" direction, a side on which the fourth electrode 108 is arranged relative to the second dielectric layer 109 will be referred to as "up" and a side on which the first electrode 104 is arranged relative to the second dielectric layer 109 will be referred to as "down". It should be noted that since each electrode and each dielectric layer are formed in a columnar shape or a cylindrical shape in the present embodiment, a "width" can be described as a length (a diameter) of each component in an in-plane direction that is a direction parallel to the substrate 111. In other words, in the subsequent description of the present embodiment, a "width" is not limited to a length of each component in the resonant direction and need only be a length of each component in a direction parallel to the substrate 111 (an in-plane direction).

In addition, the resonator 114 is configured such that the second dielectric layer 109 is sandwiched by two conductors, namely, the first electrode 104 and the fourth electrode 108. Such a configuration is known as a microstrip resonator using a microstrip line or the like with a finite length. In the present embodiment, an example using a patch antenna that is a representative microstrip resonator will be described. Therefore, hereinafter, the resonator 114 will be described as the patch antenna 114.

In the patch antenna 114, the first electrode 104, the semiconductor layer 102, the second electrode 103, the fifth electrode 106, the third electrode 107, and the fourth electrode 108 are stacked in this order from a side of the substrate 111 (a substrate side). In addition, the mesa structure 110 constituted by the semiconductor layer 102 and the second electrode 103, and the fifth electrode 106, are surrounded by the first dielectric layer 105. Therefore, it can also be described that, in the patch antenna 114, the first electrode 104, the first dielectric layer 105, the third electrode 107, and the fourth electrode 108 are stacked in this order from the side of the substrate 111. The present embodiment adopts a configuration in which the semiconductor portion 119 constituted by the third electrode 107, the mesa structure 110, the fifth electrode 106, and the first dielectric layer 105 is embedded in the second dielectric layer 109. In the present embodiment, each electrode and the mesa structure 110 constituting the semiconductor portion 119 have a columnar shape. In other words, a "width" as mentioned above can also be described as a "diameter" of a circle representing a section of the column. The substrate 111 is suitably an InP substrate.

The semiconductor layer 102 internally includes the RTD 101 which is a semiconductor. In this case, an RTD (resonant tunneling diode) has an electromagnetic gain (a gain) in a frequency band of a terahertz wave.

The RTD 101 is an active layer which has a resonant tunneling structure including a plurality of tunnel barrier layers and which has a multiple quantum well structure being provided with quantum well layers between the plurality of tunnel barriers and generating a terahertz wave by an inter-subband transition of a carrier. The RTD 101 has an electromagnetic gain in a frequency range of a terahertz wave based on a photon-assisted tunneling phenomenon in a differential negative resistance region of current-voltage characteristics, and self-oscillates in the differential negative resistance region.

A quantum cascade structure (a quantum cascade laser (QCL)) having a semiconductor multilayer structure constituted by several hundred to several thousand layers may be used in place of the RTD 101. In this case, the semiconductor layer 102 is a semiconductor layer including a QCL structure. In addition, a negative resistance element such as a Gunn diode or an IMPATT diode often used in a millimeter waveband may be used in place of the RTD 101. Furthermore, instead of the RTD 101, a high-frequency element such as a transistor with one terminal terminated may be used, and a heterojunction bipolar transistor (HBT), a compound semiconductive FET, a high-electron-mobility transistor (HEMT), and the like may also be suitably used. Moreover, a differential negative resistor of a Josephson element using a superconductor may be used in place of the RTD 101.

The first electrode 104 is formed on the substrate 111, and the semiconductor layer 102 is formed on the first electrode 104. In addition, the semiconductor layer 102 and the first electrode 104 are electrically connected to each other. In order to reduce ohmic loss, the semiconductor layer 102 and the first electrode 104 are preferably connected to each other with low resistance. The second electrode 103 is arranged on a side of the semiconductor layer 102 opposite to the side on which the first electrode 104 is arranged, and the second electrode 103 and the semiconductor layer 102 are electrically connected to each other. Furthermore, the first electrode 104 which is a grounded conductor is grounded.

The second electrode 103 is an electrode (an ohmic electrode) that is ohmically connected to (in ohmic contact with) the semiconductor layer 102 and is suitable for reducing ohmic loss and RC delay attributable to series resistance. When the second electrode 103 is used as an ohmic electrode in this manner, for example, materials such as Ti/Pd/Au, Ti/Pt/Au, AuGe/Ni/Au, TiW, Mo, and ErAs are suitably used. In addition, when a region in contact with the second electrode 103 of the semiconductor layer 102 is a semiconductor doped with a high concentration of impurities, contact resistance can be further lowered which is suitable for realizing a higher output and a higher frequency. Since an absolute value of a negative resistance indicating a magnitude of a gain of the RTD 101 used in a terahertz wave band is generally in the order of 1 to 100Ω, electromagnetic wave loss must be limited to 1% thereof or less. Therefore, as a guide, contact resistance in an ohmic electrode must be kept to or below 1Ω. In addition, for operating in the terahertz wave band, a typical value of the width of the semiconductor layer 102 (≈width of the second electrode 103) is around 0.1 to 5 μm. Therefore, in the second electrode 103, resistivity must be set to or lower than 10 Ω·μm$^2$ and contact resistance must be kept within a range of 0.1 to few Ω.

It should be noted that the second electrode 103 need not be ohmic and may be configured using a Schottky-connected metal or the like. In this case, since a contact interface between the second electrode 103 and the semiconductor layer 102 exhibits a rectifying property, the element 100 is suitably configured as a terahertz wave detector.

The fifth electrode 106 is formed inside the first dielectric layer 105 and connected to the second electrode 103. In addition, the fifth electrode 106 electrically connects the second electrode 103 and the third electrode 107 to one another. When a height of the second electrode 103 can be set sufficiently high, the fifth electrode 106 is not essential in the present embodiment. In other words, the second electrode 103 and the third electrode 107 may be directly connected to each other.

The third electrode 107 is formed inside the second dielectric layer 109 and connected to the fifth electrode 106. The third electrode 107 is in contact with the first dielectric layer 105 which surrounds the fifth electrode 106. The third electrode 107 is arranged so as to oppose the first electrode 104 via the first dielectric layer 105 and is electrically connected to the second electrode 103 via the fifth electrode 106.

The fourth electrode 108 is connected to the third electrode 107 and arranged so as to oppose the first electrode 104 via the second dielectric layer 109. In addition, the fourth electrode 108 is electrically connected to the second electrode 103 via the third electrode 107 and the fifth electrode 106.

A structure that provides an electrical connection between upper and lower layers such as the fifth electrode 106 and the third electrode 107 in this manner is referred to as a via. Using such a via, each of the first electrode 104 and the fourth electrode 108 can perform a role of an electrode for injecting a current into the RTD 101. The fifth electrode 106 and the third electrode 107 which are vias are preferably constituted by a material with a resistivity of $1 \times 10^{-6}$ Ω·m or lower. Specifically, a metal or a metal compound such as Ag, Au, Cu, W, Ni, Cr, Ti, Al, an AuIn alloy, or TiN may be suitably used.

The mesa structure 110 is constituted by the semiconductor layer 102 and the second electrode 103. The mesa structure 110 is configured such that a periphery thereof is covered by the first dielectric layer 105 and the mesa structure 110 is embedded in the first dielectric layer 105. In this case, a mesa structure refers to a structure of which a section in the height direction forms a trapezoid, a rectangle, or the like.

A height $h_0$ of the mesa structure 110 is equal to a sum of a height of the semiconductor layer 102 and a thickness of the second electrode 103. More specifically, the height $h_0$ of the mesa structure 110 is equal to a sum of a maximum value of the thickness of the second electrode 103 and the height of the semiconductor layer 102.

The first dielectric layer 105 surrounds (covers) the mesa structure 110 and the fifth electrode 106. As the first dielectric layer 105, an inorganic material (an inorganic insulator material) such as silicon oxide ($\varepsilon_{r1}$=4), silicon nitride ($\varepsilon_{r1}$=7), aluminum oxide, or aluminum nitride is suitably used. In this case, $\varepsilon_{r1}$ denotes relative permittivity of the first dielectric layer 105. This is because the first dielectric layer 105 is required to have an insulating property in order to behave as an insulator and a high-resistance element which block electricity with respect to DC voltage, a barrier property for preventing diffusion of a metal material used in the electrodes, and workability that enables processing with sub-micron accuracy. In other words, since the first dielectric layer 105 using such a material enables miniaturization and increased current density of the RTD 101 (diode), a higher frequency and a higher output of the element 100 (oscillator) can be realized. Furthermore, according to the first dielectric layer 105, leakage current suppression and a countermeasure against migration can be implemented with respect to an insulating structure of the diode. In this case, a thickness $h_1$ of the first dielectric layer 105 is greater than the height $h_0$ of the mesa structure 110. In the present embodiment, the thickness $h_1$ of the first dielectric layer 105 is a distance (a shortest distance) between the third electrode 107 and the first The second dielectric layer 109 is arranged between the first electrode 104 and the fourth electrode 108 and surrounds the third electrode 107 and the first dielectric layer 105. As the second dielectric layer 109, an organic material (an organic dielectric material) such as BCB (benzocyclobutene, manufactured by The Dow Chemical Company, $\varepsilon_{r2}=2$), Teflon™, or polyimide is suitably used. In this case, $\varepsilon_{r2}$ denotes relative permittivity of the second dielectric layer 109. This is because the second dielectric layer 109 is required to be made of a material which enables formation of a film thickness of 3 μm or more, which has low loss and low permittivity in the terahertz band, and which has good workability (flatness, etching property, or the like). According to the second dielectric layer 109 constituted by such a material, since the second dielectric layer 109 can be made thick, radiant efficiency of the patch antenna 114 is increased and a higher output of the element 100 is realized. In other words, due to the dielectric layer in the patch antenna 114 being thick, loss in a terahertz wave conductor is reduced and radiant efficiency (reception efficiency) is improved. Alternatively, an inorganic dielectric material such as a TEOS oxide film or spin-on glass which enables relatively thick films to be formed and which has low permittivity may be used as the second dielectric layer 109.

Although the greater the thickness $h_2$ of the second dielectric layer 109, the higher the radiant efficiency of the patch antenna 114, since a multimode resonance may occur if the second dielectric layer 109 is too thick, the second dielectric layer 109 is preferably designed within a range of at least the thickness $h_1$ of the first dielectric layer 105 and not more than $\lambda/10$. In this case, $\lambda$ denotes a wavelength (an equivalent wavelength) in the second dielectric layer 109 of a terahertz wave that resonates in the resonator 114, and when a wavelength of the terahertz wave in a vacuum is denoted by $\lambda_0$ and the relative permittivity of the second dielectric layer 109 is denoted by $\varepsilon_{r2}$, $\lambda$ is expressed such that $\lambda=\lambda_0 \times \varepsilon_{-1/2}$. From the perspective of impedance matching between the antenna and space (air), the smaller the difference in permittivity between the antenna and air, the better. Therefore, as the second dielectric layer 109, a material which differs from that of the first dielectric layer 105 and which has relative permittivity low enough to satisfy $\varepsilon_{r1}>\varepsilon_{r2}$ is preferably used. It should be noted that the patch antenna 114 is set such that a width in the AA' direction (the resonant direction) of the fourth electrode 108 which is a patch conductor constitutes a $\lambda/2$ resonator.

The element 100 is an active antenna that integrates the patch antenna 114 having the RTD 101. Therefore, a frequency $f_{THz}$ of a terahertz wave oscillated from the element 100 can be determined as a resonant frequency of a whole parallel resonant circuit combining reactances of the patch antenna 114 and the semiconductor layer 102. Specifically, from the description related to an equivalent circuit of an oscillator according to Non Patent Literature 1, with respect to a resonant circuit combining admittances of an RTD and an antenna, a frequency satisfying amplitude conditions of expression (1) and phase conditions of expression (2) can be determined as the oscillation frequency $f_{THz}$. In this case, $Re[Y_{RTD}]$ denotes a real part of admittance of the semiconductor layer 102 (the RTD 101) and has a negative value. In addition, $Re[Y_{ANT}]$ denotes a real part of admittance of the patch antenna 114, and $Im[Y_{RTD}]$ and $Im[Y_{ANT}]$ respectively denote imaginary parts of admittances of the semiconductor layer 102 and the patch antenna 114.

$$Re[Y_{RTD}]+Re[Y_{ANT}] \leq 0 \quad (1)$$

$$Im[Y_{RTD}]+Im[Y_{ANT}]=0 \quad (2)$$

Bias Circuit

Next, the bias circuit 120 connected to the patch antenna 114 via a line 125 will be described. The bias circuit 120 is a circuit for supplying bias voltage to the RTD 101.

Dimensions of the line 125 preferably prevent interference with a resonance electric field inside the patch antenna 114 and, for example, a width of the line 125 is suitably 1/10 of the equivalent wavelength $\lambda$ or less ($\lambda/10$ or less). In this case, the line 125 desirably extends in a direction perpendicular to the AA' direction (the resonant direction) so as not to affect the patch antenna 114 and the like. In addition, the line 125 is preferably arranged at a node of an electric field of a terahertz wave with an oscillation frequency of $f_{THz}$ which is stationary in the patch antenna 114. At this point, the line 125 is configured so as to have a higher impedance than an absolute value of the differential negative resistance of the RTD 101 in a frequency band near the oscillation frequency $f_{THz}$ to suppress interference with the electric field of the oscillation frequency $f_{THz}$ which is stationary in the patch antenna 114.

The bias circuit 120 includes wiring 122, a power supply 123, a shunt resistor 121 connected in parallel to the RTD 101, and a capacitor 124 connected in parallel to the shunt resistor 121.

The wiring 122 electrically connects the power supply 123 and the line 125 to each other and is inevitably accompanied by a parasitic inductance component. Therefore, in FIGS. 1A and 1B, the wiring 122 is displayed as an inductance.

The power supply 123 supplies a current necessary for driving the RTD 101 and adjusts bias voltage. The bias voltage is typically selected from a differential negative resistance region of the RTD 101. The bias voltage from the bias circuit 120 is supplied to the element 100 via the line 125.

The shunt resistor 121 and the capacitor 124 suppress parasitic oscillation with a relatively low resonant frequency which is attributable to the bias circuit 120. In this case, the resonant frequency is typically a frequency band of 100 GHz in a direct current (DC). As a resistance value of the shunt resistor 121, a value equal to or slightly smaller than the absolute value of the differential negative resistance in the differential negative resistance region of the RTD 101 is selected. An impedance of the capacitor 124 is set equal to or slightly lower than the absolute value of the differential negative resistance of the RTD 101 in a similar manner to the shunt resistor 121. Generally, the shunt resistor 121 is preferably on a large side in the resistance value range described above and is set to around several ten pF in the present embodiment. The capacitor 124 is a decoupling capacitor and, for example, an MIM (Metal-insulator-Metal) structure that shares a substrate with the patch antenna 114 may be used.

Characteristics of Semiconductor Elements according to Comparative Examples

Figure 9A:
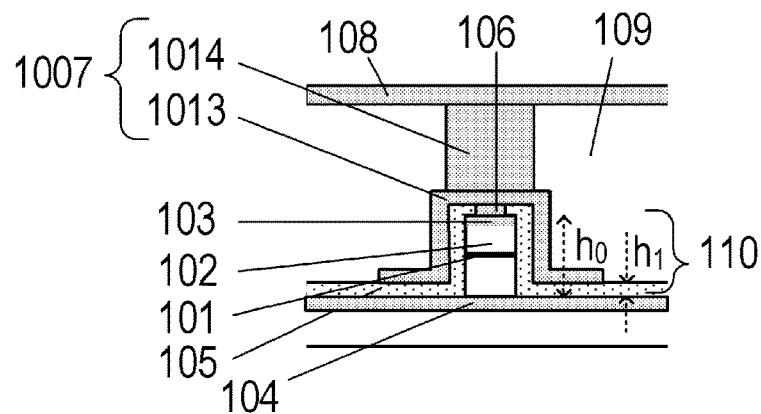
FIGS. 9A to 9C are diagrams illustrating comparative examples.
Figure 9B:
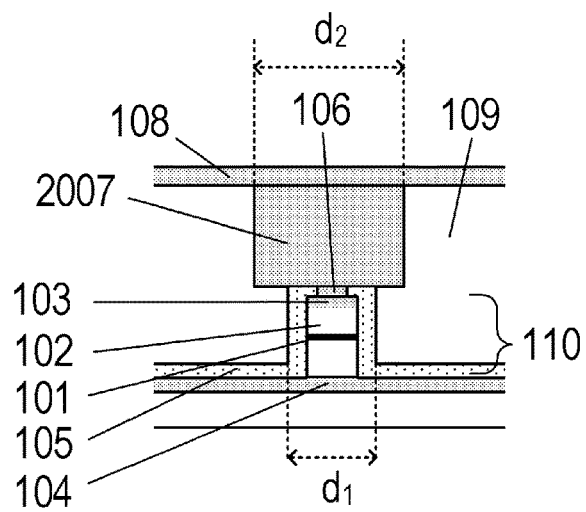

FIGS. 9A and 9B show sectional views in which semiconductor elements to be compared with the present embodiment have been cut in the resonant direction. In the drawings, same components as those of the element 100 will be denoted by same reference numerals and detailed descriptions thereof will be omitted.

In the semiconductor element shown in FIG. 9A, a third electrode 1007 is constituted by a wide sixth electrode 1013 connected to the second electrode 103 and a narrow seventh electrode 1014 connected to the fourth electrode 108. In this case, since a distance $h_1$ between the third electrode 1007 and the first electrode 104 is shorter than the height $h_0$ of the mesa structure 110, a parasitic capacitance $C_m$ of the element increases due to a structure in which the first electrode 104 and the sixth electrode 1013 sandwich the first dielectric layer 105. In addition, with miniaturization (typically, 3 μm or less) of the mesa structure 110 including the semiconductor layer 102, the fifth electrode 106 and the third electrode 1007 being vias are required to realize a processing accuracy in the order (unit) of a sub-micron (0.1 μm).

Figure 9C:
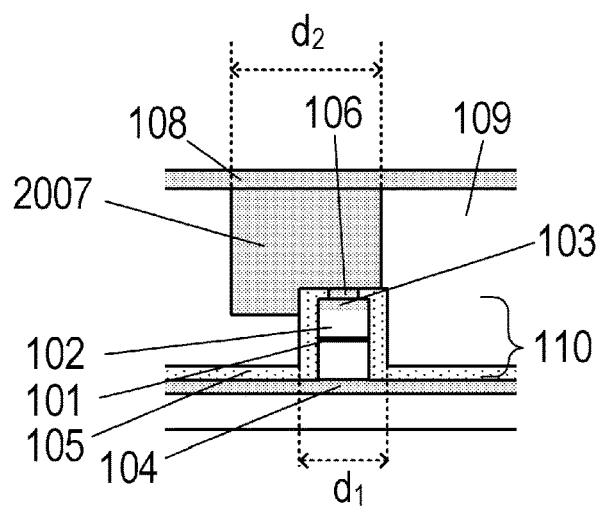

FIG. 9B shows a semiconductor element structured such that a width $d_1$ of a surface in contact with a third electrode 2007 of the first dielectric layer 105 is narrower than a width $d_2$ of a surface in contact with the first dielectric layer 105 of the third electrode 2007 ($d_1 < d_2$). When manufacturing the semiconductor element shown in FIG. 9B, eccentricity (a positional deviation) or the like of the third electrode 2007 may possibly occur as shown in FIG. 9C due to manufacturing variability. Depending on the eccentricity, there is a risk that the parasitic capacitance $C_m$ may increase. Therefore, the semiconductor element shown in FIG. 9B can be described as a structure that is not robust with respect to manufacturing error. Since the parasitic capacitance $C_m$ causes RC delay (RC time constant) and prevents a higher output and a higher frequency of the semiconductor element from being realized, RC delay must be designed shorter than a frequency of a resonating electromagnetic wave. In particular, since a parasitic capacitance attributable to wiring and an insulating structure is also not negligible in a terahertz wave band, with the miniaturization of diodes, a structure is required which is more robust with respect to parasitic capacitance attributable to manufacturing error of an element. Generally, since the capacitance $C_{RTD}$ of the RTD 101 used in a terahertz wave band is 100 fF or lower, the parasitic capacitance $C_m$ must at least be kept to or lower than 10% thereof. In addition, since an increase in the parasitic capacitance $C_m$ causes an impedance mismatch between the RTD and the antenna, the parasitic capacitance $C_m$ may also inhibit an increase in output of the semiconductor element in this regard.

Characteristics of Element according to Present Embodiment

Compared to the comparative examples described above, in the element 100 according to the present embodiment, a width $d_3$ of a connecting portion between the fifth electrode 106 and the second electrode 103 is smaller than a width $d_0$ of a connecting portion between the semiconductor layer 102 and the first electrode 104. A width $d_2$ of a surface in contact with the first dielectric layer 105 of the third electrode 107 is equal to or greater than the width $d_0$. In addition, a width $d_1$ of a surface in contact with the third electrode 107 of the first dielectric layer 105 is equal to or greater than the width $d_2$. In other words, the element 100 according to the present embodiment shown in FIGS. 1A and 1B has a structure satisfying the conditions described below.

$$h_0 < h_1 < h_2$$

$$d_3 < d_0 \leq d_2 \leq d_1$$

$h_0$: height of mesa structure 110
$h_1$: thickness of first dielectric layer 105
$h_2$: thickness of second dielectric layer 109
$d_0$: width of connecting portion between semiconductor layer 102 and first electrode 104
$d_1$: width of surface in contact with third electrode 107 of first dielectric layer 105
$d_2$: width of surface in contact with first dielectric layer 105 of third electrode 107
$d_3$: width of connecting portion between fifth electrode 106 and second electrode 103

It should be noted that the width $d_0$ is also a width of a connecting portion between the semiconductor layer 102 and the second electrode 103, a width of the semiconductor layer 102, and a width of the second electrode 103. In addition, the width $d_1$ is also a width of a region ($h_0 < h_1$) in which the thickness $h_1$ is greater than the height $h_0$ in the first dielectric layer 105.

In the present embodiment, the width $d_2$ is also a width of a surface to be connected to the fifth electrode 106 in the third electrode 107. In addition, an excessively large width $d_2$ interferes with a resonance electric field and causes resonance characteristics of the patch antenna 114 to deteriorate and radiant efficiency (reception efficiency) to decrease due to the parasitic capacitance $C_m$. Therefore, the width $d_2$ is favorably a dimension that prevents interference with the resonance electric field and, typically, the width $d_2$ is preferably λ/10 or less. Furthermore, the width $d_2$ can be reduced to a level where series resistance does not increase and, as a guide, the width $d_2$ can be reduced to around twice a skin depth. Therefore, considering reducing to a level where series resistance does not exceed 1Ω, as a guide, a typical range of the width $d_2$ is at least 0.1 μm and not more than 20 μm.

In the case where the element 100 does not include the fifth electrode 106 as described above, since $d_3$ does not exist and the height ho of the mesa structure 110 equals $h_1$, the conditions of $d_3 < d_0$ and $h_0 < h_1$ need not be satisfied. Desirably, respective center of gravity points of the semiconductor layer 102, the second electrode 103, the fifth electrode 106, and the third electrode 107 exist on a straight line and the straight line is perpendicular to the substrate 111. In addition, satisfying $d_0 < d_2$ or $d_2 < d_1$ instead of $d_0 \leq d_2 \leq d_1$ is more effective from the perspective of a structure less susceptible to positional displacement and the like.

As described above, a magnitude relationship $d_3 < d_0 \leq d_2$ of the widths of the mesa structure 110 and the respective electrodes is set and the width $d_1$ of the surface in contact with the third electrode 107 of the first dielectric layer 105 is set equal to or greater than the width $d_2$ of the surface in contact with the first dielectric layer 105 of the third electrode 107. In other words, the element 100 has a structure in which parasitic capacitance attributable to manufacturing error such as film thinning due to over-etching and eccentricity due to positional displacement is less likely to occur or, that is, a structure that is more robust with respect to manufacturing error. In addition, in the element 100, since the thickness $h_1$ of the first dielectric layer 105 is greater than the height $h_0$ of the mesa structure 110, a parasitic capacitance $C_m$ attributable to the MIM structure in which the first electrode 104 and the third electrode 107 sandwich the first dielectric layer 105 can be reduced. Furthermore, a silicon nitride layer that is an inorganic insulator film is used in the first dielectric layer 105 of which a barrier property, an insulating property, and sub-micron processing are required. BCB that is an organic dielectric film is used in the second dielectric layer 109 of which a certain thickness is required in order to increase radiant efficiency (reception efficiency) of the patch antenna 114. Accordingly, a higher frequency and a higher output of the element 100 can be realized.

First Modification

The element 100 having one RTD 101 has been described in the first embodiment. In the present modification, an element 200 including two RTDs 101 having an electromagnetic gain of a terahertz wave will be described with reference to FIGS. 2A and 2B. In this case, while increasing the number of RTDs 101 makes it difficult to realize impedance matching between the antenna and the RTDs 101, on the other hand, an effect is produced which causes current in the antenna to increase.

Figure 2A:
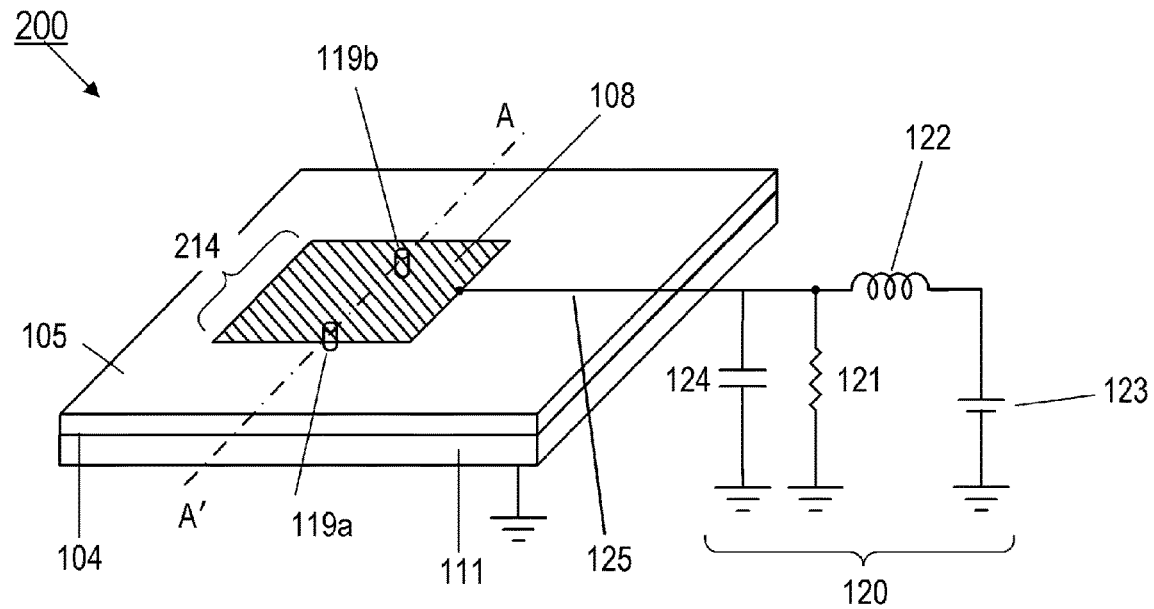
FIGS. 2A and 2B are diagrams illustrating a configuration of a semiconductor element according to a first modification.
Figure 2B:
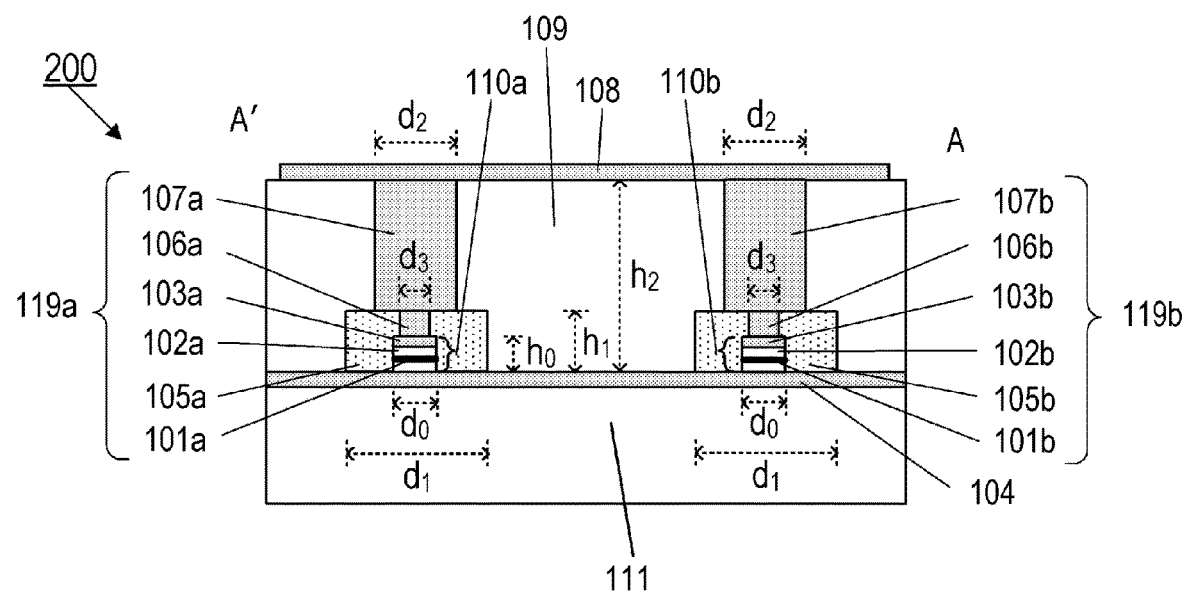

FIG. 2A is a perspective view showing an external appearance of the element 200, and FIG. 2B is a sectional view of the element 200 taken along a straight line AA' which is shown in FIG. 2A and which extends in the resonant direction. The element 200 has a patch antenna 214 and the bias circuit 120, and the patch antenna 214 has the first electrode 104, the fourth electrode 108, second dielectric layer 109, and two semiconductor portions 119. In this case, the two semiconductor portions 119 will be respectively referred to as a semiconductor portion 119a and a semiconductor portion 119b, and components such as respective electrode portions included therein will also be denoted using "a" and "b". In other words, among the components of the element 200 according to the present modification, since a component with a same reference character as a component according to the first embodiment with the exception of "a" or "b" is the same as the component according to the first embodiment, a description thereof will be omitted.

In this case, while respective configurations of the semiconductor portion 119a and the semiconductor portion 119b are similar to the configuration of the semiconductor portion 119 according to the first embodiment, positions where the semiconductor portion 119a and the semiconductor portion 119b are arranged differ from the position of the semiconductor portion 119 according to the first embodiment. Specifically, the semiconductor portion 119a is arranged at a position shifted by 34 µm in the resonant direction (in other words, the AA' direction) from a center of gravity point of the fourth electrode 108. In addition, the semiconductor portion 119b is arranged at a position shifted by −34 µm in the resonant direction (in other words, the AA' direction) from the center of gravity point of the fourth electrode 108. In other words, the semiconductor portion 119a and the semiconductor portion 119b are arranged at line-symmetric positions with respect to a straight line (a center line) which passes through the center of gravity point of the fourth electrode 108 and which is perpendicular to the resonant direction and the stacking direction as a line-symmetric axis. In this case, an RTD 101a and an RTD 101b oscillate in a mutually injection-locked manner in a state where their respective phases are mutually opposite (antiphase).

Magnitude Relationship between $h_0$ and $h_1$

Hereinafter, an impact of a magnitude relationship (ratio) between the distance $h_1$ between the first electrode 104 and a third electrode 107a (the thickness $h_1$ of the first dielectric layer 105) and the thickness ho of a mesa structure 110a with respect to the element 200 will be described with reference to FIGS. 3 and 4. In addition, while a description of the semiconductor portion 119b will be omitted for the sake of brevity in the following description with reference to FIGS. 3 and 4, it is assumed that the semiconductor portion 119b has a configuration similar to that (satisfies conditions similar to those) of the semiconductor portion 119a unless otherwise noted.

In the present modification, the fourth electrode 108 (the patch antenna 214) is a 170 µm-a-side square when viewed from above. In addition, BCB (benzocyclobutene, manufactured by The Dow Chemical Company, $\varepsilon_{r1}=2$) with a thickness $h_2$ of 5 µm is arranged as the second dielectric layer 109 between the fourth electrode 108 and the first electrode 104.

The mesa structure 110a is constituted by a semiconductor layer 102a including the RTD 101a and a second electrode 103a and is formed as a circular mesa-like structure (mesa structure). Therefore, the width $d_0$ is equivalent to a diameter of the circular mesa structure 110a, and width $d_0=2$ µm and height $h_0=0.25$ µm. In addition, width $d_3=0.9$ µm and width $d_2=5$ µm. Furthermore, it is assumed that silicon nitride ($\varepsilon_{r2}=7$) is used in a first dielectric layer 105a.

Figure 3:
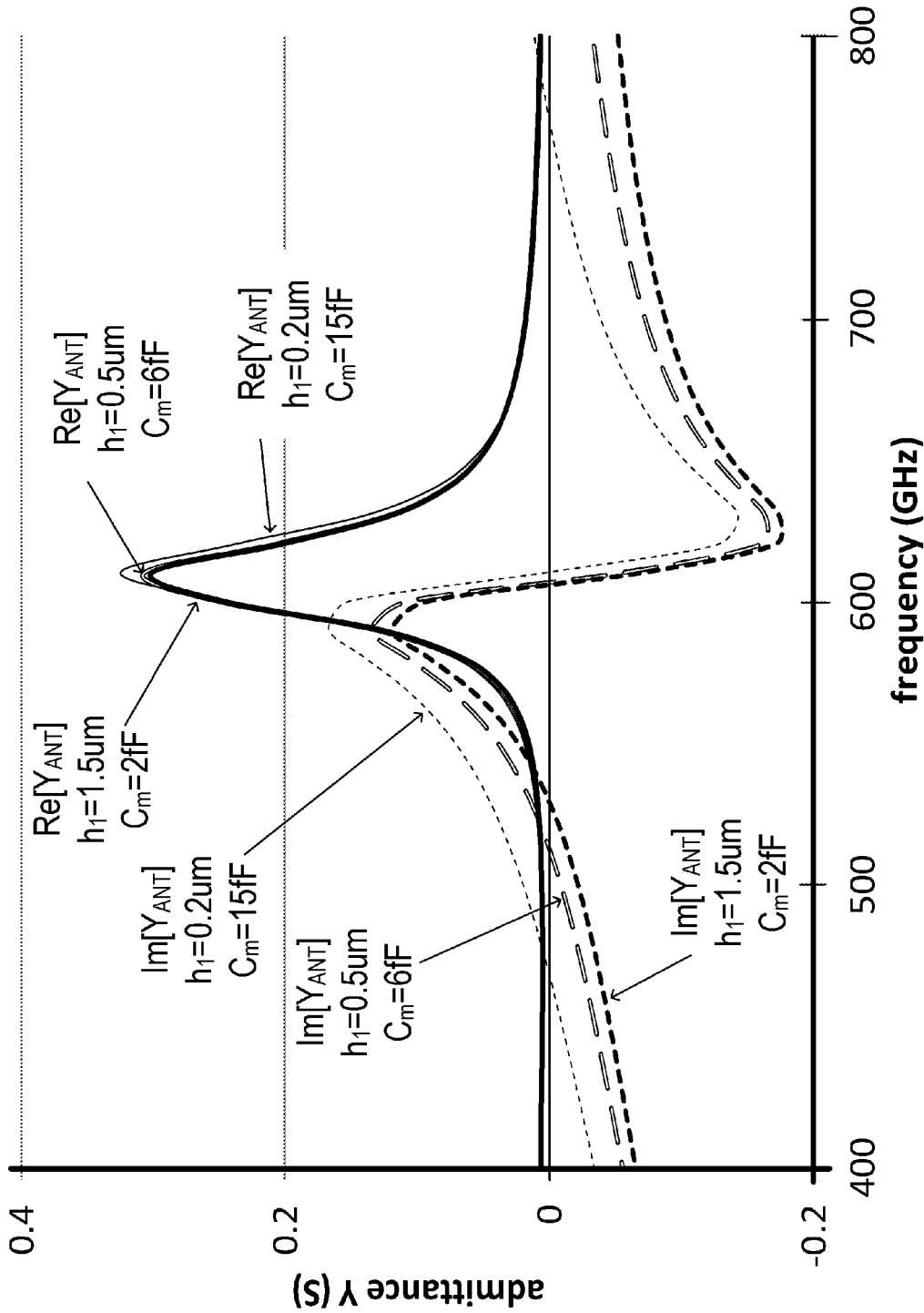
FIG. 3 is a diagram illustrating an analysis example of the semiconductor element according to the first modification.

FIG. 3 shows an example of an analysis of admittance of the patch antenna 214. Specifically, FIG. 3 shows a relationship between a frequency of a terahertz wave and the admittance of the patch antenna 214 when a plurality of values are applied to the thickness $h_1$. The admittance analysis is performed using HFSS that is three-dimensional electromagnetic field analysis software manufactured by ANSYS, Inc.

Under the conditions described above, the thickness $h_1$ of the first dielectric layer 105a is changed among three levels: 1.5 µm, 0.5 µm, and 0.2 µm. At the three levels, the parasitic capacitances $C_m$ due to the structure in which the first dielectric layer 105a is sandwiched by the first electrode 104 and the third electrode 107a can be respectively calculated as 2 fF, 6 fF, and 15 fF. In other words, the greater the thickness $h_1$ of the first dielectric layer 105a, the smaller the parasitic capacitance $C_m$. Since $h_0=0.25$ µm, $h_0<h_1$ is satisfied when $h_1=1.5$ µm and 0.5 µm and $h_0>h_1$ is satisfied when $h_1=0.2$ µm.

In addition, since a frequency satisfying $\text{Im}[Y_{ANT}]=0$ is the resonant frequency of the patch antenna 214, from FIG. 3, the resonant frequency of the patch antenna 214 is revealed to be 0.47 THz when $h_0>h_1$. By comparison, when $h_0<h_1$, it is revealed that the resonant frequency of the patch antenna 214 shifts to a high frequency of 0.51 to 0.53 THz. Therefore, with the element 200 according to the present modification which satisfies $h_0<h_1$, due to a shift of the resonant frequency to a high frequency as a result of a reduction in the parasitic capacitance $C_m$, an impedance of the patch antenna 214 at the resonant frequency shifts in a direction of matching with an impedance of the RTD 101. Consequently, an improvement in radiant efficiency of the patch antenna 214 is expected. It should be noted that, as shown in FIG. 3, $\text{Re}[Y_{ANT}]$ hardly varies even when the parasitic capacitance $C_m$ varies.

Figure 4:
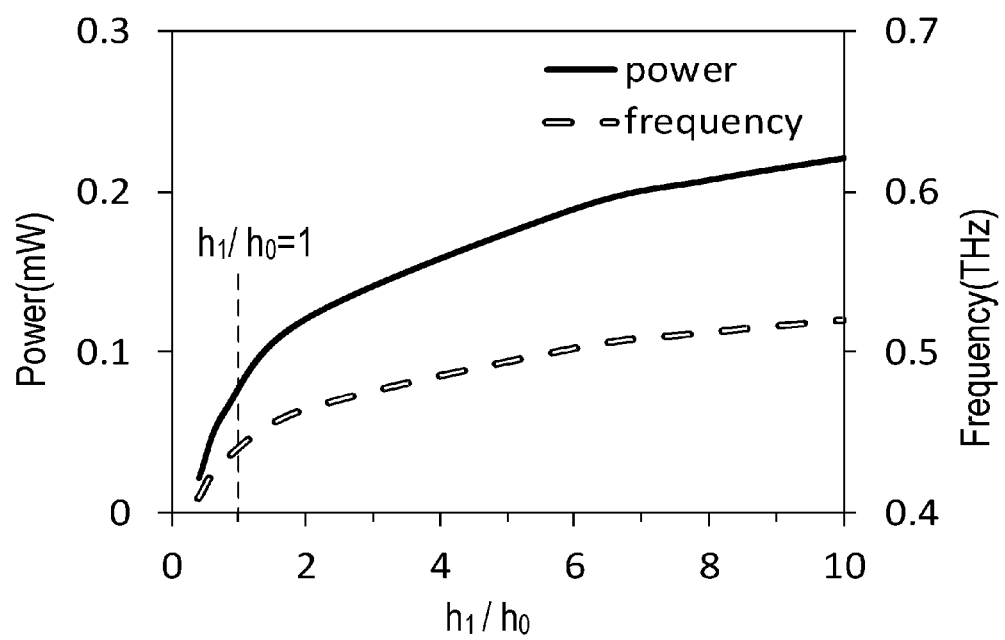
FIG. 4 is a diagram illustrating an analysis example of the semiconductor element according to the first modification.

FIG. 4 shows an analysis result of structural dependency of an oscillation frequency and an oscillation power of the element 200 in which the RTD 101a has a diameter of 2 μm. In other words, FIG. 4 shows the oscillation frequency and the oscillation power of the element 200 in accordance with a ratio of $h_1$ to $h_0$. The oscillation frequency (resonant frequency) $f_{THz}$ is estimated in consideration of reactances of the patch antenna 214, the RTD 101a, and the RTD 101b. The analysis of oscillation output is performed using an analysis method disclosed in IEEE J. Sel. Top. Quantum Electron. 19 (2013) 8500108.

In this case, the larger a value of $h_1/h_0$, the greater the suppression of the parasitic capacitance Cm of the structure in which the first dielectric layer 105a is sandwiched by the first electrode 104 and the third electrode 107. Therefore, as shown in FIG. 4, when $h_1 > h_0$, oscillation with a power of 0.1 to 0.2 mW is produced in a frequency band of 0.45 to 0.50 THz in the element 200.

Therefore, since a structure satisfying $h_1 > h_0$ reduces the parasitic capacitance $C_m$, the oscillation frequency of the element 200 in consideration of the reactances of the RTD 101a and the RTD 101b shifts to a higher frequency and an increase in oscillation power due to an improvement in the radiant efficiency of the patch antenna 214 is expected.

A double-barrier RTD made of InGaAs/AlAs grown on an InP substrate has been described as the RTD 101a and the RTD 101b in the present modification. However, structures and material systems are not limited thereto, and the semiconductor element according to the present modification can be provided even when other structures and material systems are adopted. For example, an RTD having a triple-barrier quantum well layer structure or an RTD having a multiple barrier quantum well layer structure with quadruple-barriers or more may be used.

In addition, each of the following combinations may be used as the material of an RTD. In this case, the structure and the material may be appropriately selected in accordance with a desired frequency or the like.
GaAs/AlGaAs/ and GaAs/AlAs, InGaAs/GaAs/AlAs formed on a GaAs substrate
InGaAs/InAlAs, InGaAs/AIAs, InGaAs/AlGaAsSb formed on an InP substrate
InAs/AlAsSb and InAs/AlSb formed on an InAs substrate
SiGe/SiGe formed on a Si substrate As described above, the element configuration according to the present modification is a configuration which suppresses a parasitic capacitance in accordance with miniaturization of an RTD and which is robust with respect to manufacturing variability. Therefore, since a higher frequency and a higher output due to the suppression of a parasitic capacitance can be realized, a semiconductor element (antenna) capable of oscillating or detecting a terahertz wave at a higher efficiency can be provided.

Second Modification

Figure 5A:
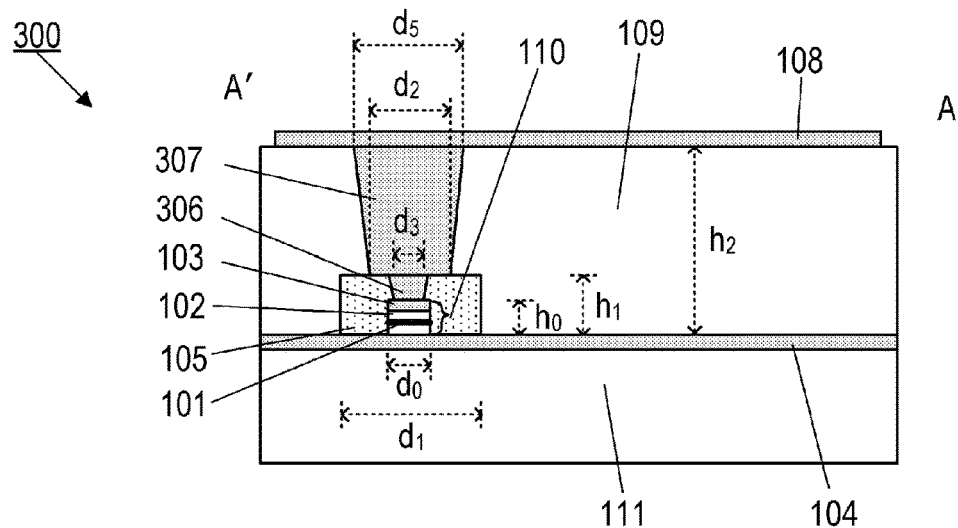
FIGS. 5A to 5C are diagrams illustrating a configuration of a semiconductor element according to a second modification.
Figure 5B:
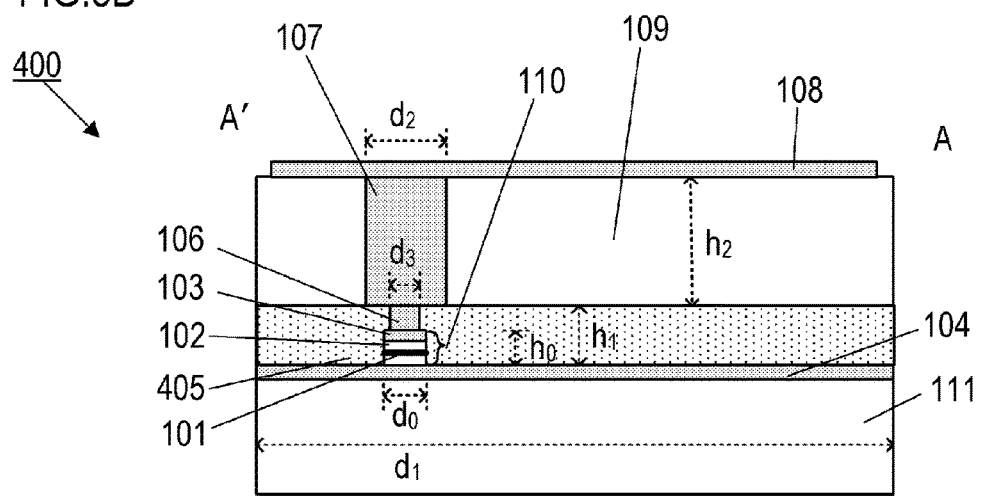
Figure 5C:
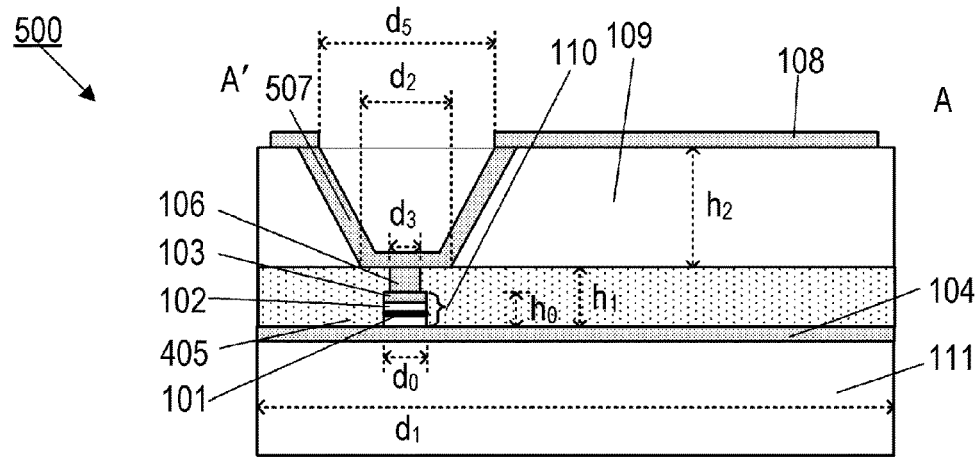
Figure 6A:
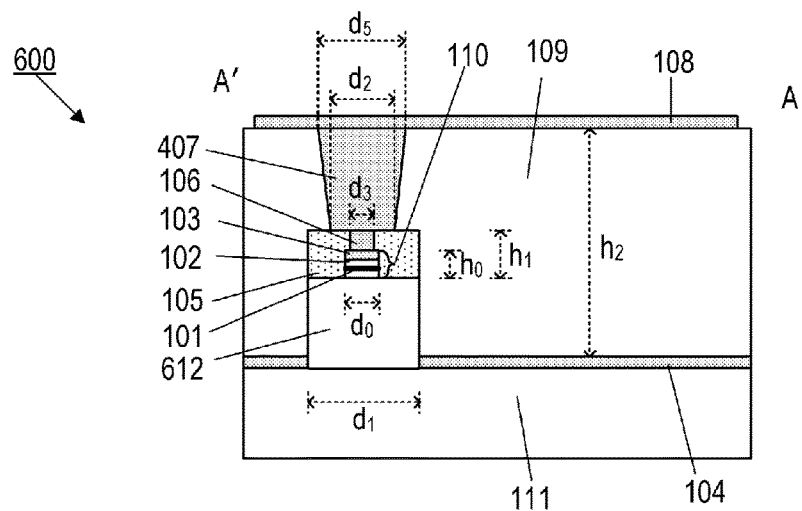
FIGS. 6A to 6C are diagrams illustrating a configuration of the semiconductor element according to the second modification.
Figure 6B:
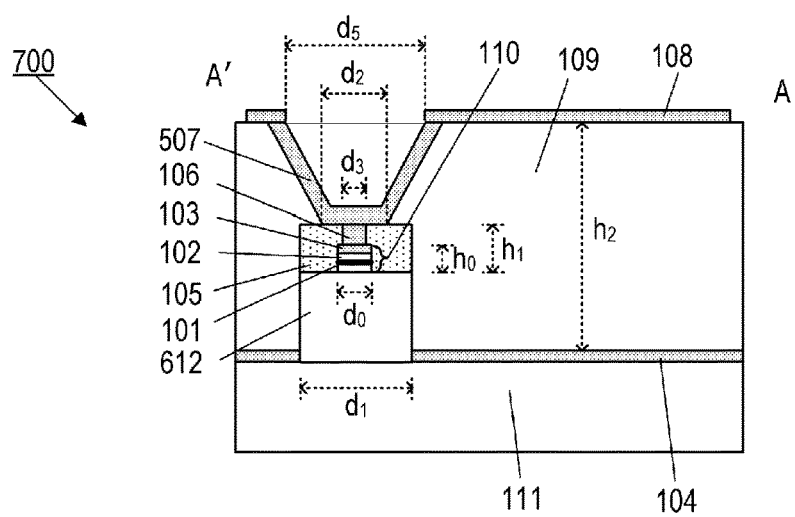
Figure 6C:
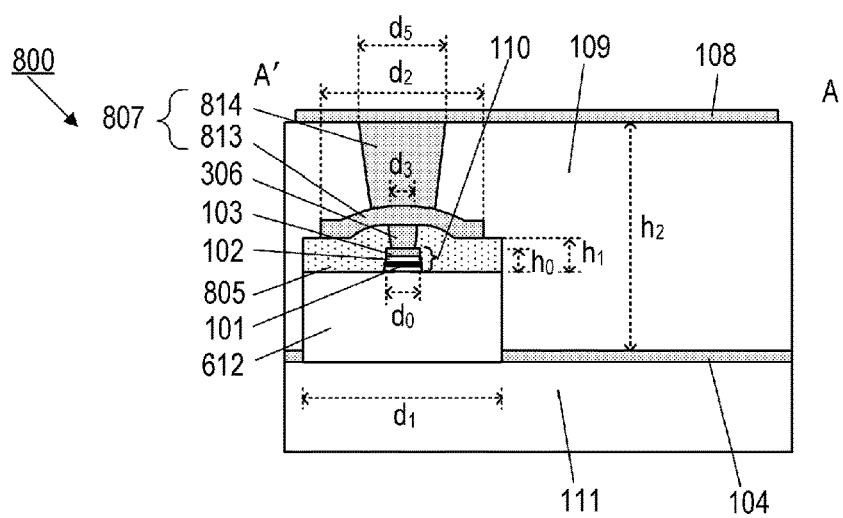

Next, other modifications of the element 100 will be described with reference to FIGS. 5A to 5C and 6A to 6C. FIGS. 5A to 5C are, respectively, diagrams illustrating configurations of elements 300, 400, and 500 which represent modifications of the element 100. In addition, FIGS. 6A to 6C are, respectively, diagrams illustrating configurations of elements 600, 700, and 800 which represent modifications of the element 100. In this case, FIGS. 5A to 5C and FIGS. 6A to 6C show sectional views of a semiconductor element cut in a resonant direction of a terahertz wave in a patch antenna in a similar manner to FIGS. 1B and 2B. In the drawings, same components as those of the element 100 will be denoted by same reference numerals as the first embodiment and detailed descriptions thereof will be omitted.

The element 300 shown in FIG. 5A has a third electrode 307 which is the third electrode 107 according to the first embodiment having adopted a tapered structure, and a fifth electrode 306 which is the fifth electrode 106 according to the first embodiment having adopted a tapered structure. A tapered structure refers to a structure of which a section cut in the AA' direction forms a trapezoid and, in this case, a structure in which a width $d_5$ of a surface of the third electrode 307 connected to the fourth electrode 108 is larger than a width $d_2$ of a surface of the third electrode 307 connected to the fifth electrode 306. It should be noted that a section of the tapered structure need not necessarily form a trapezoid and the tapered structure may have a section of which a width gradually narrows or widens from one base to the other base. The tapered structure is also a structure in which a width of a surface of the fifth electrode 306 connected to the third electrode 307 is larger than a width $d_3$ of a surface of the fifth electrode 306 connected to the second electrode 103. From the perspective of radiant efficiency, the width $d_5$ is preferably a dimension that prevents interference with the resonance electric field and, for example, the width $d_5$ is preferably λ/10 or less, and an angle Θ of the tapered shape is preferably designed so as to equal or exceed 45 degrees. In this case, the angle Θ denotes an angle satisfying $\tan\Theta = ((d_5-d_2)/2)/(h_2-h_1)$. Since shapes of semiconductor elements that are actually formed in a semiconductor process often share the same structure as the present embodiment, the tapered structure can be described as a more realistic structure.

A structure such as an element 400 shown in FIG. 5B may be adopted in which a first dielectric layer 405 is made wider and a patch antenna is formed by two layers, namely, the first dielectric layer 405 and the second dielectric layer 109. In this case, since the second dielectric layer 109 surrounds a region that is wider than at least the fourth electrode 108, the element 400 has a structure that is robust with respect to a parasitic capacitance attributable to a manufacturing error.

A structure such as an element 500 shown in FIG. 5C may be adopted in which a thin-film electrode formed on a wall surface of a via hole formed in the second dielectric layer 109 constitutes a third electrode 507. Since such a structure can be more readily formed by a semiconductor process and can be formed in a smaller number of steps, the structure is more practical. In particular, since a metal embedding step is no longer required, the structure is more practical in terms of yield and cost.

A element 600 shown in FIG. 6A has a post structure 612 connected to the mesa structure 110 between the mesa structure 110 and the substrate 111. Specifically, the element 600 is structured such that the post structure 612 which is a layer constituted by a semiconductor or a metal is arranged under the mesa structure 110 and the mesa structure 110 and the first electrode 104 are electrically connected to each other via the post structure 612. In this case, in order to suppress series resistance, the post structure 612 is preferably constituted by a heavily-doped conductive semiconductor. The highly conductive semiconductor preferably has resistivity of $1\times10^{-5}$ Ω·m or lower, and in the case of n-type $In_{53}Ga_{47}As$ or InP, a doping concentration of a donor is preferably $1\times10^{18}$ cm$^{-3}$ or higher. According to such a configuration, since the thickness $h_2$ of the second dielectric layer 109 can be further increased, radiant efficiency of a terahertz wave of the element 600 can be improved and a higher output can be realized. In addition, since the element 600 can use a semiconductor substrate on which the semiconductor layer 102 including the RTD 101 is epitaxially grown as the substrate 111, a more practical structure is realized. Moreover, since the structure of the element 600 sandwiches the first dielectric layer 105 between a third electrode 407 and the post structure 612 constituted by a semiconductor or a metal with high conductivity, parasitic capacitance can be reduced. In the element 600, the thickness $h_1$ of the first dielectric layer 105 is a distance between the third electrode 407 and the post structure 612.

A element 700 shown in FIG. 6B is structured in a similar manner to the element 500 shown in FIG. 5C without filling the inside of the third electrode 507 but by forming a thin-film electrode on a wall surface of a via hole formed in the second dielectric layer 109. Since such a structure can be more readily formed by a semiconductor process and can be formed in a smaller number of steps in a similar manner to the structure shown in FIG. 5C, the structure is more practical.

A element 800 shown in FIG. 6C has a structure that more closely resembles a structure that is actually formed in a semiconductor forming process. In this case, in order to relax superimposition accuracy of the respective layers and secure a margin for manufacturing error, a third electrode 807 is constituted by a wide sixth electrode 813 connected to the second electrode 103 and a narrow seventh electrode 814 connected to the fourth electrode 108. Even with such a structure, since the thickness condition expressed by $h_0 < h_1$ and the width condition expressed by $d_2 \leq d_1$ are satisfied, the element 800 is capable of reducing parasitic capacitance while securing a margin for manufacturing error. When a thickness distribution of a first dielectric layer 805 exists in the resonant direction as in the case of FIG. 6C, a minimum value of the thickness of the first dielectric layer that is sandwiched by the sixth electrode 813 and the post structure 612 can be defined as $h_1$. In other words, the thickness $h_1$ can also be described as a shortest distance between the post structure 612 and the third electrode 807 (the sixth electrode 813).

First Practical Example

In the present practical example, a more detailed configuration of the element 200 which oscillates a terahertz wave according to the first modification be described with reference to FIGS. 2A and 2B. Hereinafter, characteristic portions of the element 200 according to the first modification will be described and descriptions of other portions will be omitted.

The element 200 is a semiconductor element which has the patch antenna 214 and which is capable of single-mode oscillation at a frequency band of 0.45 to 0.50 THz.

The patch antenna 214 includes the first electrode 104, the mesa structure 110a, the second electrode 103a, a fifth electrode 106a, the third electrode 107a, a fourth electrode 108a, the first dielectric layer 105a, and the second dielectric layer 109. While the patch antenna 214 also includes a mesa structure 110b, a second electrode 103b, a fifth electrode 106b, a third electrode 107b, a fourth electrode 108b, and a first dielectric layer 105b, these components will not be described below. In other words, while a description of a configuration of the semiconductor portion 119b will be hereinafter omitted for the sake of brevity, it is assumed that the semiconductor portion 119b has a configuration similar to that of the semiconductor portion 119a unless otherwise noted.

In the patch antenna 214, the first electrode 104, the semiconductor layer 102a, the second electrode 103a, the fifth electrode 106a, the third electrode 107a, and the fourth electrode 108 are stacked in this order from a side of the substrate 111, and the respective components are electrically connected. The patch antenna 214 is a square patch antenna in which one side of the fourth electrode 108 is 170 μm and in which a resonator length L is 170 μm.

The first electrode 104 is constituted by a metal made up of Ti layer (20 nm)/Pd layer (20 nm)/Au layer (200 nm) and a semiconductor made of a n+-InGaAs layer (100 nm) with an electron concentration of $1 \times 10^{18}$ cm$^{-3}$ or higher. In addition, the metal and the semiconductor are connected by low-resistance ohmic contact.

The mesa structure 110a is constituted by the semiconductor layer 102a including the RTD 101a and the second electrode 103a and is formed as a mesa-like structure (a mesa structure). For example, in the case of the 2 μm-diameter circular mesa structure 110a used in the present practical example, a magnitude of a differential negative resistance of the RTD 101a is approximately −30Ω per one diode. In this case, a differential negative conductance ($G_{RTD}$) of the semiconductor layer 102a including the RTD 101a is estimated as 30 mS and a diode capacitance ($C_{RTD}$) of the RTD 101a is estimated as 10 fF.

The RTD 101a is a double barrier-structure RTD constituted by a multiple quantum well structure made of lattice-matched InGaAs/AlAs. A semiconducting heterostructure of the RTD is a structure disclosed in J Infrared Milli Terahz Waves (2014) 35:425-431. Among current-voltage characteristics of the RTD 101a, a measurement value of peak current density is 9 mA/μm$^2$ and a measurement value of differential negative conductance per unit area is 10 mS/μm$^2$.

The RTD 101a and the RTD 101b are arranged at positions respectively shifted by 34 μm and −34 μm in the resonant direction (the AA' direction) from the center of gravity point of the fourth electrode 108. It should be noted that the positions of the RTDs affect input impedance when feeding the patch antenna 214 with high frequency from the RTDs. The RTD 101a and the RTD 101b oscillate in a mutually injection-locked manner in a state where their respective phases are mutually opposite (antiphase).

The second electrode 103a is an ohmic electrode made up of Ti layer (20 nm)/Pd layer (20 nm)/Au layer (200 nm). The second electrode 103a is connected by low-resistance ohmic contact with a semiconductor which is formed in the semiconductor layer 102a and which is made of a n+-InGaAs layer (100 nm) with an electron concentration of $1 \times 10^{18}$ cm$^{-3}$ or higher.

The fifth electrode 106a and the third electrode 107a are constituted by conductors including Cu.

The fourth electrode 108 uses a metal layer made principally of an Au thin film with low resistivity. Specifically, the fourth electrode 108 is constituted by a metal including Ti (5 nm)/Au (300 nm). BCB (benzocyclobutene, manufactured by The Dow Chemical Company, $\varepsilon_{r2}=2$) with a thickness of 5 μm is arranged as the second dielectric layer 109 between the fourth electrode 108 and the first electrode 104.

In addition, the fourth electrode 108 is connected to the bias circuit 120 via the line 125. The fourth electrode 108 is connected to the line 125 at a node of a high-frequency electric field with an oscillation frequency of $f_{THz}$ which is stationary in the patch antenna 214 and suppresses interference between the line 125 and a resonance electric field of a terahertz wave with the oscillation frequency of $f_{THz}$. The capacitor 124 is an MIM (Metal-insulator-Metal) capacitor.

In the present practical example, the capacitor 124 has a magnitude of 100 pF. The wiring 122 including wire bonding is connected to the capacitor 124, and bias voltage of the RTD 101a is adjusted by the power supply 123.

Fabrication Method

Figure 7:
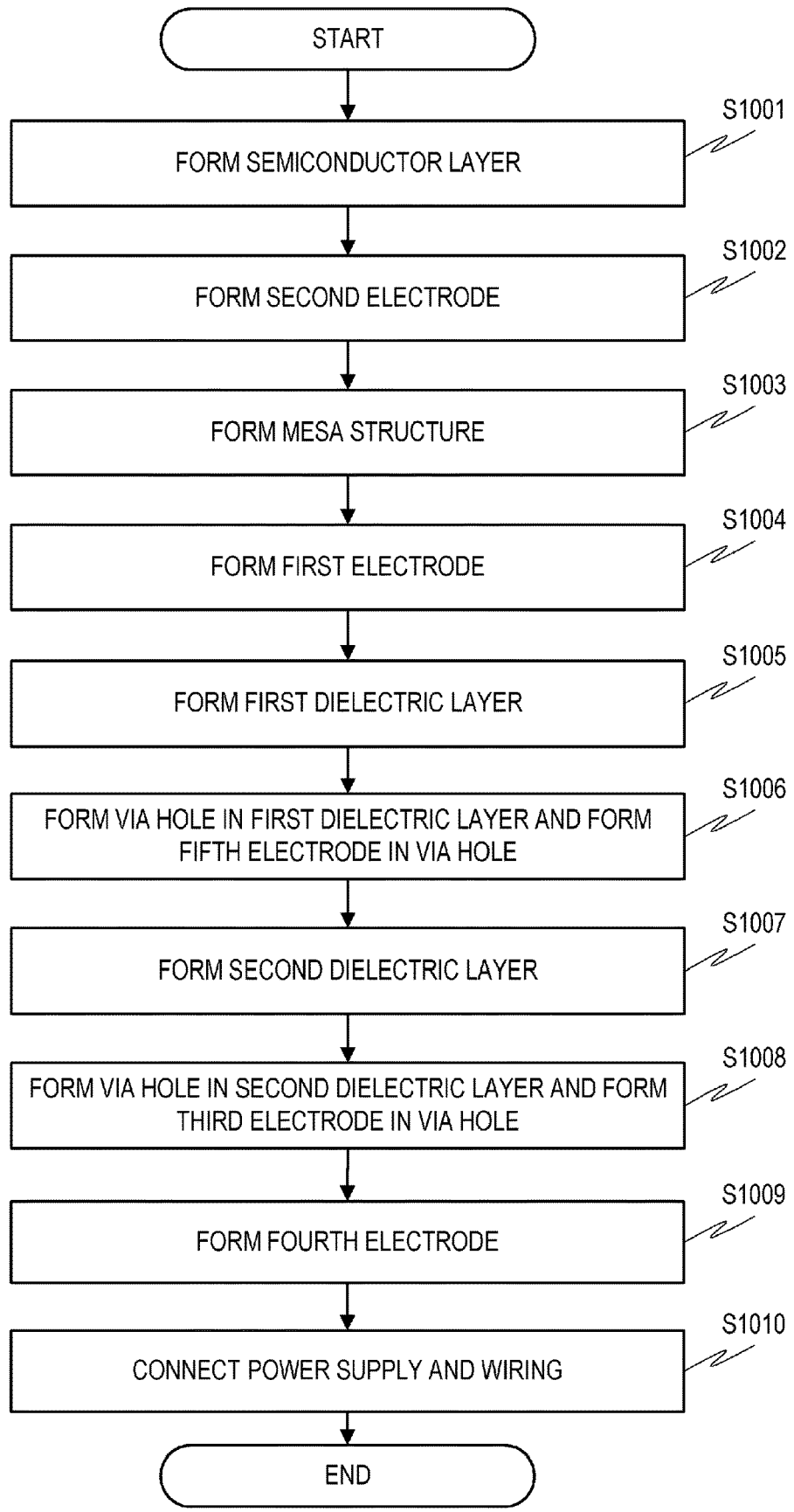
FIG. 7 is a flow chart showing a fabrication method of the semiconductor element according to the first embodiment.

Hereinafter, a fabrication method (a manufacturing method) of the element 100 according to the first embodiment will be described with reference to a flow chart shown in FIG. 7. It should be noted that the fabrication method (the manufacturing method) described below may be carried out by a human fabricator or, alternatively, a machine (an apparatus) such as a forming apparatus may carry out the fabrication method (the manufacturing method).

Figure 8A:
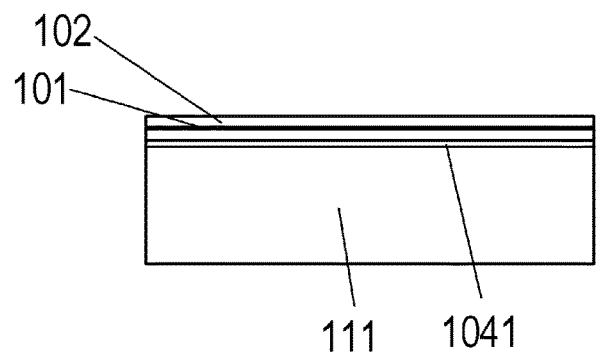
FIGS. 8A to 8H are diagrams showing the semiconductor element in each step of the fabrication method of the semiconductor element according to the first embodiment.

In S1001, as shown in FIG. 8A, the semiconductor layer 102 including the RTD 101 and a highly-conductive second semiconductor layer 1041 doped at a high concentration are formed on the substrate 111. In this case, the semiconductor layer 102 and the second semiconductor layer 1041 are formed by epitaxially growing an InGaAs/AlAs-based semiconductor multilayer film structure by a molecular beam epitaxy (MBE) method or a metalorganic vapor-phase epitaxy (MOVPE) method. The second semiconductor layer 1041 preferably has resistivity of $1\times10^{-5}$ $\Omega\cdot$m or lower, and in the case of n-type $In_{53}Ga_{47}As$ or InP, a doping concentration of a donor is preferably $1\times10^{18}$ $cm^{-3}$ or higher.

Figure 8B:
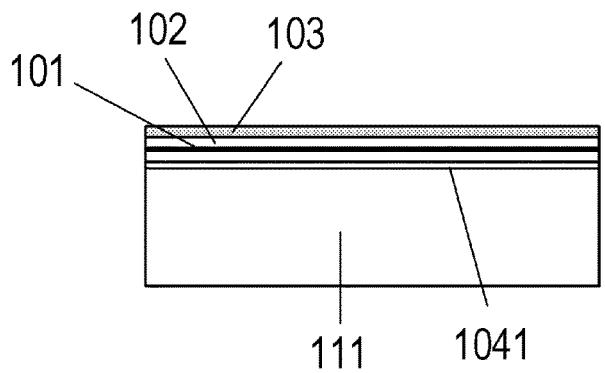

In S1002, as shown in FIG. 8B, by forming Ti/Pd/Au layers (20/20/200 nm) by a sputtering method on the semiconductor layer 102 including the RTD 101 (on the semiconductor layer), the second electrode 103 which is an ohmic electrode is formed.

Figure 8C:
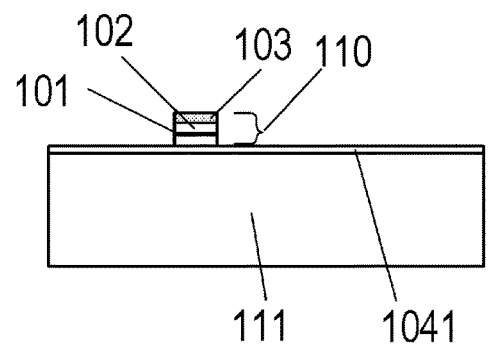

In S1003, as shown in FIG. 8C, the second electrode 103 and the semiconductor layer 102 including the RTD 101 are molded into a circular mesa shape with a diameter of 2 μm to form the mesa structure 110. In this case, photolithography and dry etching by ICP (inductively coupled plasma) may be used to form the mesa shape.

Figure 8D:
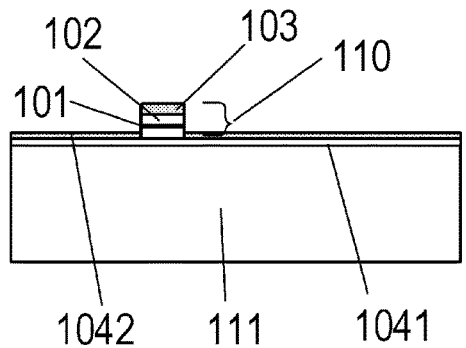

In S1004, as shown in FIG. 8D, a metal layer 1042 made up of Ti layer (20 nm)/Pd layer (20 nm)/Au layer (200 nm) is formed by a liftoff method on the etched surface. It should be noted that the first electrode 104 is constituted by the metal layer 1042 and the second semiconductor layer 1041. In other words, the first electrode 104 is formed by forming a part of the first electrode 104 on the substrate in S1001 and forming a remaining portion of the first electrode 104 in S1004.

Figure 8E:
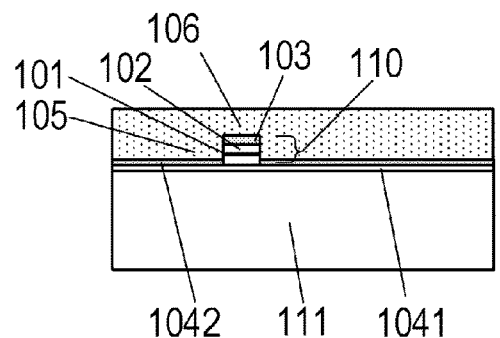

In S1005, as shown in FIG. 8E, a film of silicon nitride of which the thickness $h_1$ is 0.5 μm is formed by a plasma CVD method and the first dielectric layer 105 is formed so as to surround the mesa structure 110.

Figure 8F:
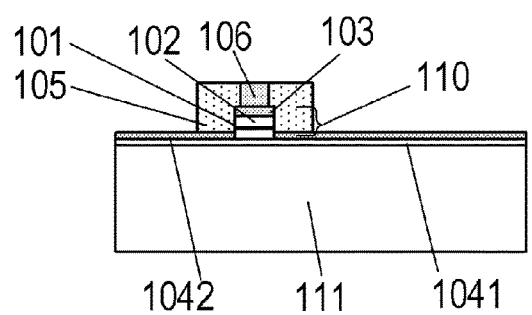

In S1006, as shown in FIG. 8F, a via hole with a width of 1.5 μm is formed using photolithography and dry etching at a location where the fifth electrode 106 is to be formed in the first dielectric layer 105. In addition, the fifth electrode 106 which is a via is formed inside the via hole with a conductor including Cu. Therefore, the width 1.5 μm of the via hole is a length equal to the width $d_3$. In this case, in S1006, the fifth electrode 106 is formed such that the width $d_3$ is shorter than the width $d_0$.

Figure 8G:
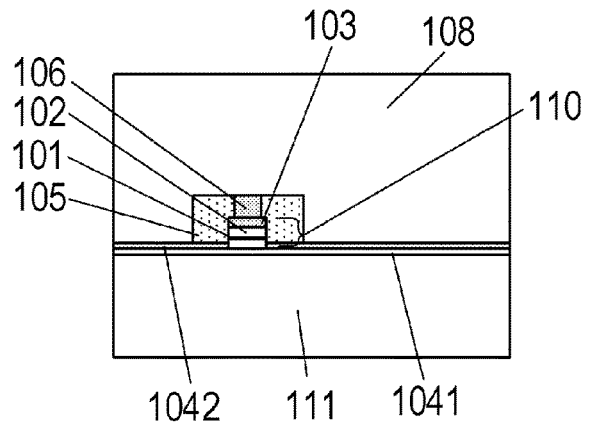

In S1007, as shown in FIG. 8G, the second dielectric layer 109 is formed by performing embedding and planarization using BCB of which the thickness $h_2$ is 5 μm by a spin coating method and a dry etching method. In this case, the second dielectric layer 109 is formed so as to surround the mesa structure 110, the fifth electrode 106, and the first dielectric layer 105.

Figure 8H:
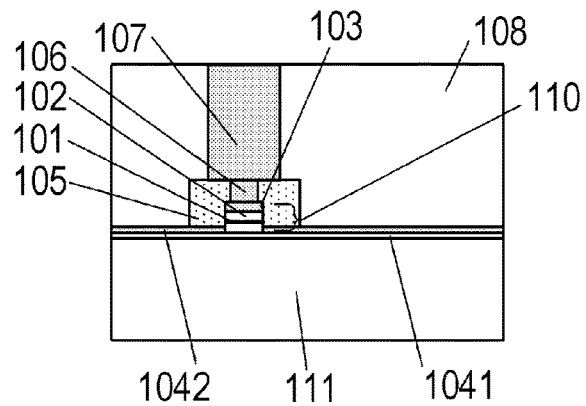

In S1008, as shown in FIG. 8H, BCB in a portion where the third electrode 107 is to be formed is removed by photolithography and dry etching to form a via hole. In doing so, using photolithography including gray scale exposure enables a taper angle of the via hole formed in the second dielectric layer 109 to be arbitrarily controlled. In addition, the third electrode 107 which is a via is formed inside the via hole with a conductor including Cu. At this point, the via hole is plugged by Cu and planarized so as to come into contact with the fifth electrode 106 using a sputtering method, an electroplating method, and a chemical mechanical polishing method. The third electrode 107 is formed such that the width $d_2$ is at least equal to the width $d_0$ and not more than the width $d_1$.

In S1009, as shown in FIG. 1B, the fourth electrode 108 which is constituted by Ti/Au and which, together with the first electrode 104, sandwiches the second dielectric layer 109 is formed by a liftoff method. Accordingly, the patch antenna 114 can be fabricated (generated).

In S1010, a fabricator forms the shunt resistor 121 and the MIM capacitor 124 and connects the shunt resistor 121 and the MIM capacitor 124 to the wiring 122 and the power supply 123 by wire bonding or the like. Subsequently, the fabricator connects the power supply 123 and the like to the patch antenna 114 via the line 125 to complete the element 100.

Power to the element 100 fabricated in this manner is supplied from the bias circuit 120, and the element 100 operates as an oscillator when a bias current is supplied by applying bias voltage that is normally in a differential negative resistance region.

As described above, the semiconductor portion 119a and the semiconductor portion 119b according to the first practical example (the first modification) are configured in a similar manner to the semiconductor portion 119 according to the first embodiment. Therefore, the element 200 according to the first practical example can also be formed by the fabrication method described above.

In this manner, the element 100 is fabricated such that the dielectric layers are sufficiently thick and, at the same time, the width of each electrode satisfies prescribed conditions. Therefore, according to the element 100, radiant efficiency of the patch antenna 114 is improved and, at the same time, an occurrence of a parasitic capacitance can be suppressed.

Other Modifications

While preferred embodiments and modifications of the present invention have been described above, it is to be understood that the present invention is not limited to these embodiments and modifications and various modifications and changes may be made without departing from the spirit and scope of the present invention. For example, the present invention is also applicable to a program that enables a forming apparatus or a computer to execute the fabrication method of the element described above.

In addition, for example, although the embodiments and the modifications are described above on the assumption that a carrier is an electron, the embodiments and the modifications are not limited thereto and a hole may be used instead. Furthermore, materials of the substrate and the dielectric bodies may be selected depending on the intended use and semiconductors such as silicon, gallium arsenide, indium arsenide, and gallium phosphide, glass, ceramics, Teflon™, and resins such as polyethylene terephthalate can be used.

Furthermore, while a square patch antenna is used as a resonator of a terahertz wave in the embodiments and the modifications described above, a shape of a resonator is not limited thereto. For example, a resonator with a structure using a patch conductor having a polygonal shape such as a rectangle or a triangle, a circular shape, or an elliptical shape may be used.

Moreover, the number of differential negative resistance elements to be integrated into a semiconductor element is not limited to one and a resonator having a plurality of differential negative resistance elements may be used. The number of lines is also not limited to one and a configuration provided with a plurality of lines may be adopted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-189244, filed on Oct. 4, 2018, which is hereby incorporated by reference herein in its entirety.

What is claimed is:

1. A semiconductor element which oscillates or detects a terahertz wave, the semiconductor element comprising:
    a first electrode;
    a semiconductor layer that is a gain medium at a wavelength of the terahertz wave;
    a second electrode which is connected to the semiconductor layer and which forms a mesa structure together with the semiconductor layer;
    a third electrode electrically connected to the semiconductor layer;
    a fourth electrode connected to the third electrode;
    a first dielectric layer which is in contact with the third electrode and which surrounds the mesa structure; and
    a second dielectric layer which is arranged between the first electrode and the fourth electrode, which surrounds the third electrode, and which is made of a different material from the first dielectric layer, wherein
    the first electrode, the semiconductor layer, the second electrode, the third electrode, and the fourth electrode are stacked in this order on a side of a substrate in a direction perpendicular to the side of the substrate, and
    if a direction parallel to the side of the substrate is defined as an in-plane direction, the following mathematical expression is satisfied
    $d_0 \leq d_2 \leq d_1$, where
    $d_0$: length in the in-plane direction of the semiconductor layer,
    $d_1$: length in the in-plane direction of a first surface, which is a surface of the first dielectric layer that is in contact with the third electrode, and
    $d_2$: length in the in-plane direction of a second surface, which is a surface of the third electrode that is in contact with the first dielectric layer.

2. The semiconductor element according to claim 1, wherein a distance between the first electrode and the third electrode is longer than a length of the mesa structure in the direction perpendicular to the side of the substrate.

3. The semiconductor element according to claim 1, further comprising a post structure which is a layer made of a semiconductor or a metal and which is to be connected to the mesa structure, the post structure being arranged between the mesa structure and the substrate, wherein
    a distance between the post structure and the third electrode is longer than a length of the mesa structure in the direction perpendicular to the side of the substrate.

4. The semiconductor element according to claim 1, wherein a length of the second dielectric layer in the direction perpendicular to the side of the substrate is longer than a distance between the first electrode and the third electrode.

5. The semiconductor element according to claim 1, wherein the first dielectric layer surrounds a stack in which (1) the semiconductor layer, (2) the second electrode, and (3) a fifth electrode which is arranged between the second electrode and the third electrode and which is connected to the third electrode and the second electrode are stacked in this order on the side of the substrate in a direction perpendicular to the side of the substrate.

6. The semiconductor element according to claim 5, wherein a length in the in-plane direction of a connecting portion between the fifth electrode and the second electrode is shorter than a length in the in-plane direction of the semiconductor layer.

7. The semiconductor element according to claim 1, wherein the second electrode is an electrode that is ohmically connected to the semiconductor layer.

8. The semiconductor element according to claim 1, wherein the second dielectric layer has lower relative permittivity than the first dielectric layer.

9. The semiconductor element according to claim 1, wherein the first dielectric layer is made of an inorganic material.

10. The semiconductor element according to claim 1, wherein the second dielectric layer is made of an organic material.

11. The semiconductor element according to claim 1, wherein the semiconductor layer includes a resonant tunneling diode.

12. The semiconductor element according to claim 1, comprising a patch antenna.

* * * * *